United States Patent
Ban et al.

(10) Patent No.: US 8,854,116 B2
(45) Date of Patent: Oct. 7, 2014

(54) SEMICONDUCTOR DEVICE

(75) Inventors: Yoko Ban, Tokyo (JP); Koji Kuroki, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 791 days.

(21) Appl. No.: 13/153,977

(22) Filed: Jun. 6, 2011

(65) Prior Publication Data

US 2011/0298290 A1    Dec. 8, 2011

(30) Foreign Application Priority Data

Jun. 7, 2010    (JP) ................................. 2010-129733

(51) Int. Cl.
*G05F 1/10*    (2006.01)
*G11C 5/14*    (2006.01)

(52) U.S. Cl.
CPC ....................................... *G11C 5/147* (2013.01)
USPC .......................................................... 327/534

(58) Field of Classification Search
CPC ................ G05F 3/08; G05F 3/20; G05F 3/24
USPC ........................... 327/534, 535, 537, 538, 543
See application file for complete search history.

(56) References Cited

U.S. PATENT DOCUMENTS 6,552,596 B2 *  4/2003  Cowles et al. ................. 327/318
7,385,435 B2 *  6/2008  Pham et al. .................... 327/534

FOREIGN PATENT DOCUMENTS

JP         2000-357961       12/2000

* cited by examiner

*Primary Examiner* — Jeffrey Zweizig (57) ABSTRACT

In one embodiment, to maintain the operation stability of a semiconductor device even when an external voltage changes. An input signal discrimination unit operates with a power supply potential supplied from a first power supply line VDDI. The input signal discrimination unit compares an input signal VIN with a reference potential Vref. The comparison result is inverted into a signal V0 by an inverter INV1. A power supply sensor circuit monitors the potential of the first power supply line VDDI. If an external potential VDDI falls below a reference potential VX, the power supply sensor circuit turns on a second current source. When the second current source is turned on, an operating current is supplied to a discrimination unit from the second current source as well as a first current source.

20 Claims, 6 Drawing Sheets

SEMICONDUCTOR DEVICE

BACKGROUND OF THE INVENTION

1. Field of the Invention

The present invention relates to a semiconductor device, and more particularly to a semiconductor device which includes an input signal discrimination unit that can cope with a change in operating voltage.

2. Description of Related Art

Small amplitude signals are input to semiconductor devices such as a DRAM (Dynamic Random Access Memory). Such input signals are compared with a reference potential by an input signal discrimination unit, and their logic levels are discriminated basedon the comparison results.

The input signal discrimination unit needs a high sensitivity in order to discriminate a minute potential difference between an input signal and the reference potential. Among the known input signal discrimination units having a high sensitivity are the ones described in Japanese Patent Application Laid-Open No. 2000-357961.

When the input signal discrimination unit changes in operating voltage, its sensitivity also varies. More specifically, when the operating voltage of the input signal discrimination unit drops, the source-drain currents (operating currents) of the transistors therein decrease to reduce the sensitivity of the input signal discrimination unit.

SUMMARY

In one embodiment, there is provided a semiconductor device that includes an input signal discrimination unit that operates with a power supply potential supplied from a first power supply line; and a power supply sensor circuit that compares a potential of the first power supply line with a predetermined potential. The input signal discrimination unit includes a discrimination unit that discriminates a logic level of an input signal, and a current source that is connected to the first power supply line and supplies an operating current to the discrimination unit. The current source supplies a first current value to the discrimination unit as the operating current, and, when the first current value decreases due to a drop in the potential of the first power supply line from the predetermined potential, the current source maintains the first current value so as to compensate the decrease of the first current value.

According to the present invention, a drop in the sensitivity of the input signal discrimination unit can be suppressed by a control corresponding to a change in the operating voltage.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENT

A representative example of the technical concept of the present invention for solving the problem will be described below. It will be understood by those skilled in the art that various modifications and alterations may be made within the scope of claims of the present invention, and such modifications and alterations are also embraced within the scope of claims of the present invention. The description of the specification and the drawings are therefore to be considered exemplary, not restrictive.

The technical concept of the present invention is to detect the external voltage by a voltage sensor circuit and, when the external voltage drops, to enhance the sensitivity of the input signal discrimination unit by positively increasing its operating current. More specifically, when the external voltage falls below a predetermined value, an assisting current source arranged in parallel with the regular current source is activated to compensate the operating current to a desired current value. This prevents the input signal discrimination unit from an excessive reduction in sensitivity. It should be noted that the threshold of being below the predetermined value may be one for digital processing or one for analog processing.

Preferred embodiments of the present invention will be explained below in detail with reference to the accompanying drawings.

Figure 1:
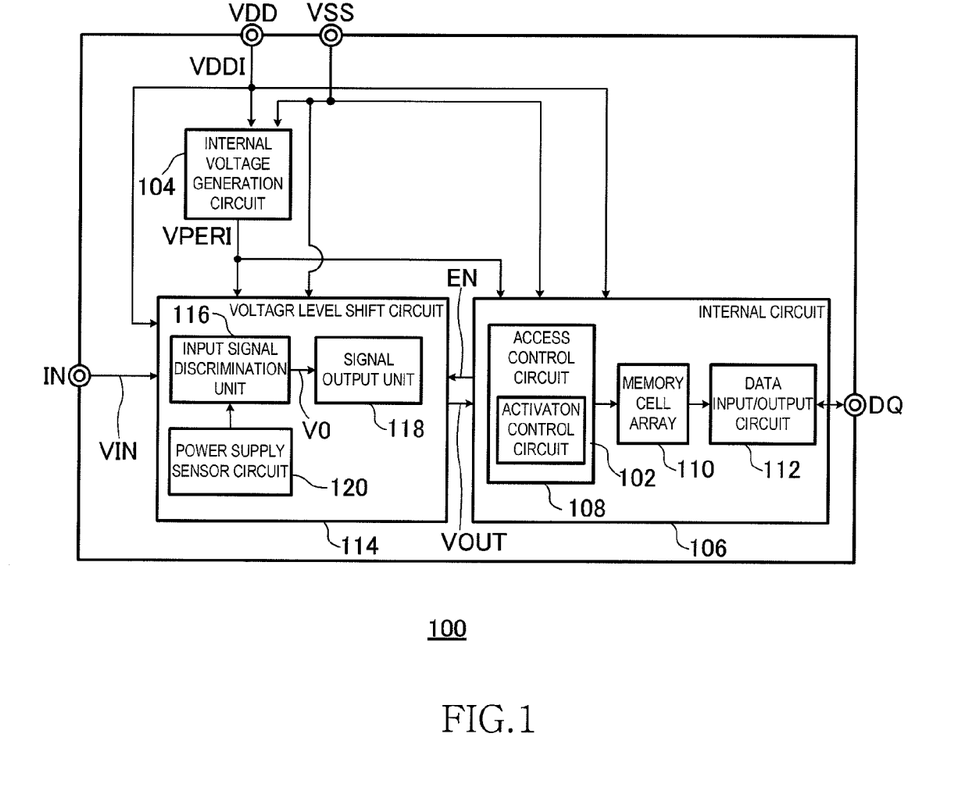
FIG. 1 is a functional block diagram of a semiconductor memory device.

FIG. 1 is a functional block diagram of a semiconductor memory device 100. The semiconductor memory device 100 according to the present embodiment is a SDRAM (Synchronous Dynamic Random Access Memory), type of a DDR (Double-Data-Rate). The semiconductor memory device 100 has a VDD terminal and a VSS terminal as power supply terminals, an IN terminal as a signal input terminal, and a DQ terminal as a data input/output terminal.

The semiconductor memory device 100 includes an internal voltage generation circuit 104, a voltage level shift circuit 114, and an internal circuit 106. An external potential VDD from the VDD terminal and a ground potential VSS from the VSS terminal are supplied to the internal voltage generation circuit 104, the voltage level shift circuit 114, and the internal circuit 106.

Based on a power supply potential VDDI and the ground potential VSS, the internal voltage generation circuit 104 steps down the power supply potential VDDI to generate an internal potential VPERI that is constant regardless of potential variations of the power supply potential VDDI. The internal voltage generation circuit 104 supplies the internal potential VPERI to the voltage level shift circuit 114 and the internal circuit 106. For the sake of simplifying the following description, the present embodiment will be described with VDDI=1.2 (V), VPERI=1.0 (V), and VSS=0.0 (V). The power supply potential VDDI is at the same level as that of the external potential VDD.

The voltage level shift circuit 114 includes an input signal discrimination unit 116, a signal output unit 118, and a power supply sensor circuit 120. Various types of input signals are supplied to the voltage level shift circuit 114 from the input terminal IN. The input signals are binary logic signals that express an address, clock, command, etc. The input signal discrimination unit 116 converts an input signal VIN into a signal V0 in the voltage range of VSS to VDDI. The signal output unit 118 converts the signal V0 into a signal VOUT in the voltage range of VSS to VPERI. As a result, the input signal VIN is supplied to the components of the internal circuit 106 as the signal VOUT in the range of VSS to VPERI. The power supply sensor circuit 120 detects a drop in the power supply potential VDDI. The input signal discrimination unit 116 increases the operating current when the power supply potential VDDI drops. Details will be given later. It should be noted that there has only to be at least one power supply sensor circuit 120 for a plurality of input signal discrimination units 116 and a plurality of signal output units 118 corresponding to a plurality of IN terminals.

The internal circuit 106 includes an access control circuit 108, a memory cell array 110, and a data input/output circuit 112. The access control circuit 108 controls access to the memory cell array 110 according to the logic that is expressed by the signal VOUT. The access control circuit 108 includes an address decoder, command decoder, control logic, etc. The access control circuit 108 also includes an activation control circuit 102. The activation control circuit 102 generates an enable signal EN and supplies the enable signal EN to the voltage level shift circuit 114. The enable signal EN becomes high level when in a normal operation of the semiconductor device, and becomes low level when at rest such as sleeping. The enable signal EN is released from a sleep (restored to a high level) by a not-shown control circuit. The data input/output circuit 112 controls data transmission and reception between memory cells in the memory cell array 110 that are selected by the access control circuit 108 and the DQ terminal. The internal circuit 106 is supplied with VDDI, VPERI, and VSS, and operates on such power supplies.

Figure 2:
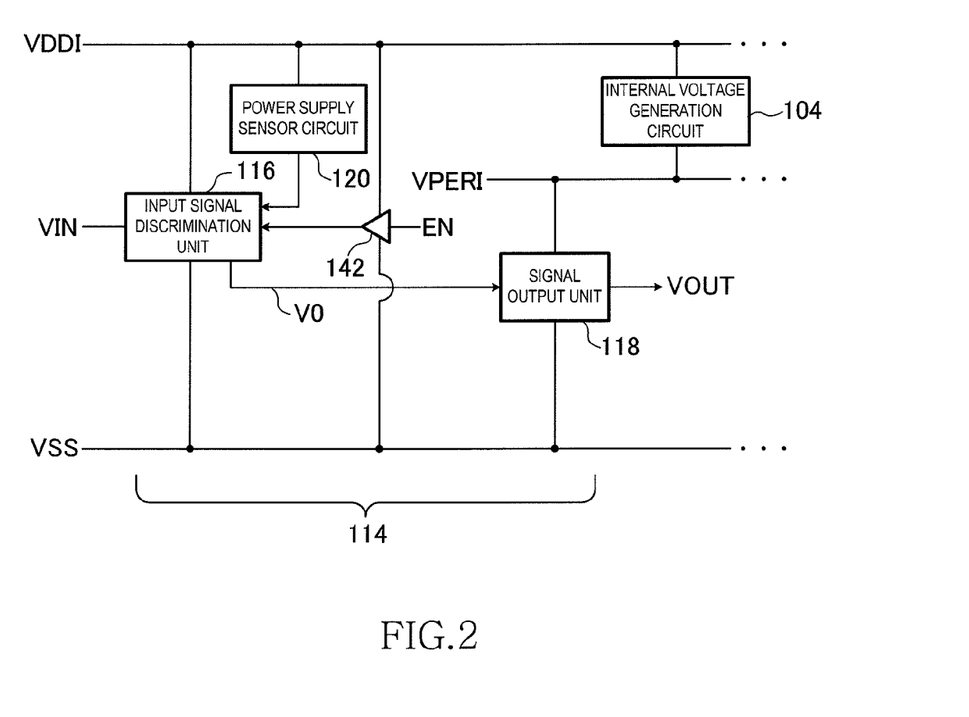
FIG. 2 is a functional block diagram of the input signal discrimination unit and its vicinity.

FIG. 2 is a functional block diagram of the input signal discrimination unit 116 and its vicinity. The input signal discrimination unit 116 is connected to a power supply line (first power supply line) to which the power supply potential VDDI is supplied and a power supply line (third power supply line) to which the ground potential VSS is supplied. The input signal VIN is supplied to the input signal discrimination unit 116. The enable signal EN of the activation control circuit 102 is converted by a buffer 142 into a signal in the range of VSS to VDDI, which is supplied to the input signal discrimination unit 116. The power supply sensor circuit 120 detects a change in the power supply potential VDDI and notifying the input signal discrimination unit 116 of a drop in the power supply potential VDDI. Details will be given later.

The internal voltage generation circuit 104 steps down the power supply potential VDDI to generate the potential VPERI. The signal output unit 118 is connected to a power supply line (second power supply line) to which the power supply potential VPERI is supplied and the third power supply line. The signal output unit 118 generates the signal VOUT in the range of VSS to VPERI.

Figure 3:
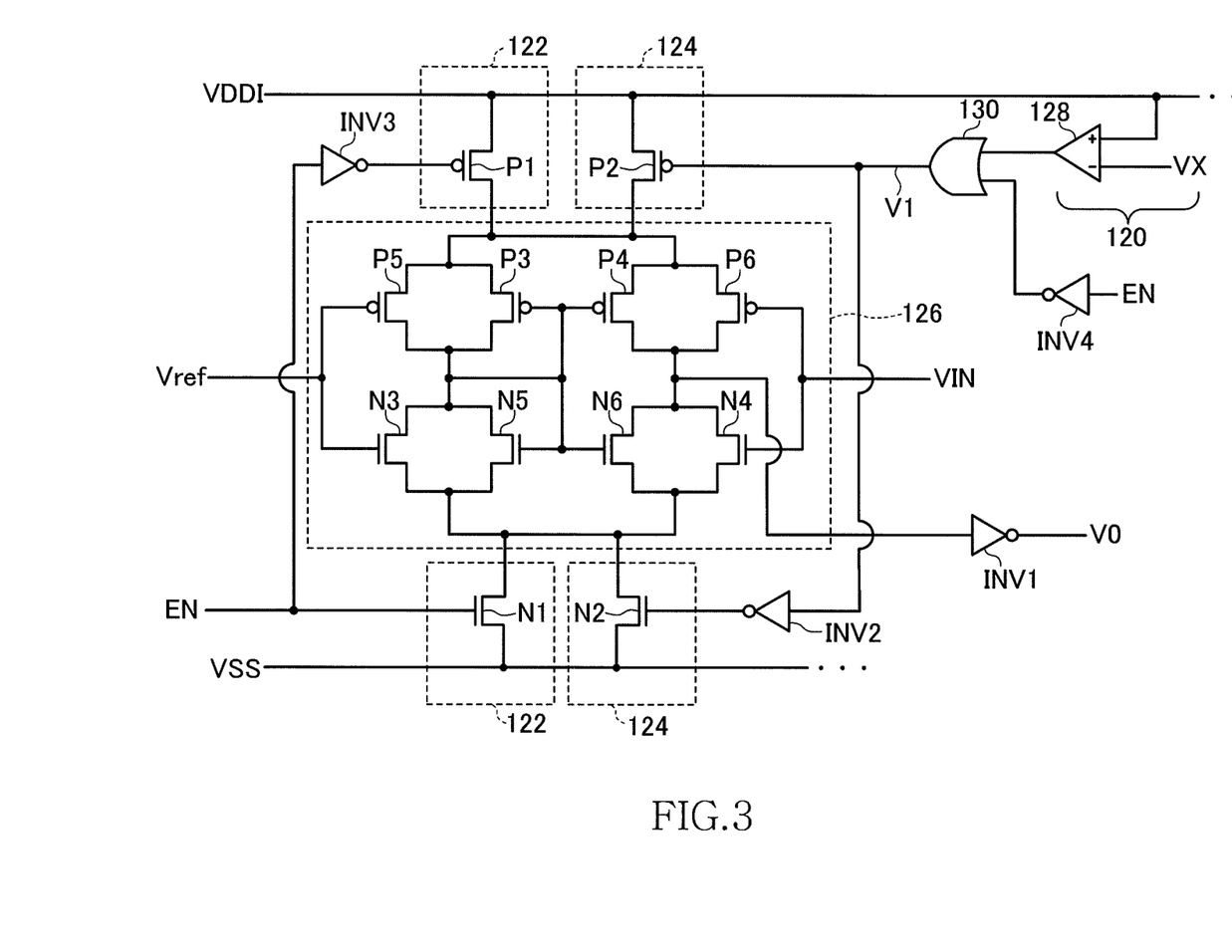
FIG. 3 is a circuit diagram of the input signal discrimination unit and the power supply sensor circuit.

FIG. 3 is a circuit diagram of the input signal discrimination unit 116 and the power supply sensor circuit 120. The input signal discrimination unit 116 includes first control elements 122, second control elements 124, and a discrimination unit 126. The discrimination unit 126 is configured as a differential circuit, and includes PMOS transistors P3, P4, P5, and P6, and NMOS transistors N3, N4, N5, and N6. The PMOS transistors P5 and P6 and the NMOS transistors N5 and N6 are added to suppress variations in the response characteristic of the discrimination unit 126, with a known circuit configuration as shown in FIG. 1 of Patent Document 1. In the present embodiment, the discrimination unit 126 compares the binary input signal VIN with a reference potential Vref. The comparison result is inverted into a signal V0 by an inverter INV1. If VIN>Vref, the signal V0 becomes low level. If VIN<Vref, the signal V0 becomes high level.

The discrimination unit 126 is connected to the power supply potential VDDI through the PMOS transistors P1 and P2, and connected to the ground potential VSS through the NMOS transistors N1 and N2. The PMOS transistors P1 and P2 feed an operating current from the first power supply line of the power supply potential VDDI. The NMOS transistors N1 and N2 drain an operating current to the third power supply line of the ground potential VSS. That is, the input signal discrimination unit 116 is driven based on the voltage VDDI between the power supply potential VDDI and the ground potential VSS. The PMOS transistor P1 and the NMOS transistor N1 function as the "first control elements." The PMOS transistor P2 and the NMOS transistor N2 function as the "second control elements."

The signal V0 which is binarized in the range of VSS to VDDI is converted into a voltage amplitude of VSS to VPERI by the signal output unit 118 at the subsequent stage, and supplied to the internal circuit 106 as the output signal VOUT.

The first control elements 122 are controlled by the enable signal EN. The enable signal EN is supplied to the gate of the NMOS transistor N1. An inverted signal of the enable signal EN, inverted by an inverter INV3, is supplied to the gate of the PMOS transistor P1. If the enable signal EN is at a high level, both the PMOS transistor P1 and the NMOS transistor N1 turn on (electrically conducting) to connect the discrimination unit 126 to VDDI and VSS. In other words, the high level of the enable signal EN turns on the first control elements (PMOS transistor P1 and NMOS transistor N1), and an operating current is supplied to the discrimination unit 126 through the first control elements 122.

The second control elements 124 are controlled by the enable signal EN and the power supply sensor circuit 120. The power supply sensor circuit 120 includes a comparator 128 (differential circuit). VDDI is supplied to the non-inverting input terminal of the comparator 128. A reference potential VX is supplied to the inverting input terminal. In the present embodiment, the reference potential VX is the same as VDDI at normal case, which is 1.2 (V) regardless of variations in VDDI. The output signal of the comparator 128 and the inverted signal of the enable signal EN are input to the two inputs of an OR element 130. With such a configuration, the OR element 130 outputs a signal V1 of low level only if VDDI on the first power supply line is lower than the reference potential VX and the enable signal EN is at a high level. It should be noted that the comparator 128 may perform the comparison processing based on a reference potential VX that is at a predetermined ratio to VDDI and is not dominated by variations in VDDI, resulting from the output of a band gap circuit or the like. Using such a method, even if the external potential VDD supplied to the VDD terminal of the semiconductor device 100 is constantly 1.0 V, the discrimination unit 126 can provide performance comparable to that of the discrimination unit 126 when operating with 1.2 V. This makes it possible to construct a semiconductor device that operates with 1.2 V and one that operates with 1.0 V on an identical silicon bulk.

The signal V1 is supplied to the gate of the PMOS transistor P2. An inverted signal of the signal V1, inverted by an inverter INV2, is supplied to the gate of the NMOS transistor N2. When the enable signal EN is at a high level and the power supply potential VDDI drops, the second control elements 124 (PMOS transistor P2 and NMOS transistor N2) turn on, so that an operating current is also supplied to the discrimination unit 126 through the second control elements 124 additionally.

In summary, the operation of the input signal discrimination unit 116 is as follows: Initially, when the activation control circuit 102 sets the enable signal EN at a low level, all the current sources, i.e., the first control elements 122 and the second control elements 124 are off (electrically not conducting). The discrimination unit 126 thus makes no operation. The output of the discrimination unit 126 is controlled to High or Low by a not-shown circuit.

When the enable signal EN is set to a high level, an operating current is supplied from the first control elements 122 to the discrimination unit 126. Here, if the power supply potential VDDI drops due to a change in power supply, an operating current is supplied from the second control elements 124 in addition to the current that is passed by the first control elements 122 whose current value is reduced due to the lower power supply potential VDDI. With such a configuration, it is possible to supply a desired sufficient operating current to the discrimination unit 126 even when the power supply potential VDDI drops. In other words, the second control elements 124 function as an assisting current source in case of a voltage drop of the power supply potential VDDI.

Figure 4:
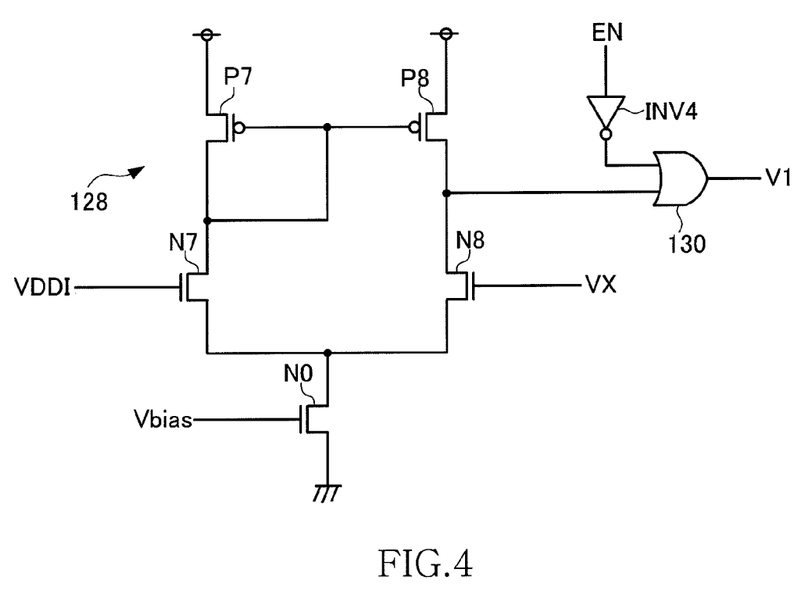
FIG. 4 is a circuit diagram of the comparator.

FIG. 4 is a circuit diagram of the comparator 128. The comparator 128 is a differential circuit that includes PMOS transistors P7 and P8 and NMOS transistors N7, N8, and N0, and compares the power supply potential VDDI with the reference potential VX. A bias voltage Vbias is applied to the gate of the NMOS transistor N0. The output voltage, which shows the comparison result, is input to the OR element 130. If VDDI>VX, the output voltage becomes high level. If VDDI<VX, the output voltage becomes low level. Note that the OR element 130 may be replaced with an analog-capable functional element to switch the signal V1 of the comparator from a digital output to an analog output. The signal V1, a digital signal with two possible logical values (two potentials), is thereby changed into an analog signal with a plurality of potentials. In such a case, the inverter INV2 (FIG. 3) is also changed into an analog-capable function accordingly. With such modifications, the second control elements 124 (PMOS transistor P2 and NMOS transistor N2) supply an accessory assist current value corresponding to the value of change of the power supply potential VDDI, which the power supply sensor circuit 120 detects with respect to the predetermined potential (VX), to the discrimination unit 126 in an analog fashion. With a predetermined value of external voltage as a threshold, the PMOS transistor P2 and the NMOS transistor N2 supply an assist current value to the discrimination unit 126 in an analog fashion in response to the linear signal V1 which is supplied to the gate electrodes of the transistors.

Figure 5:
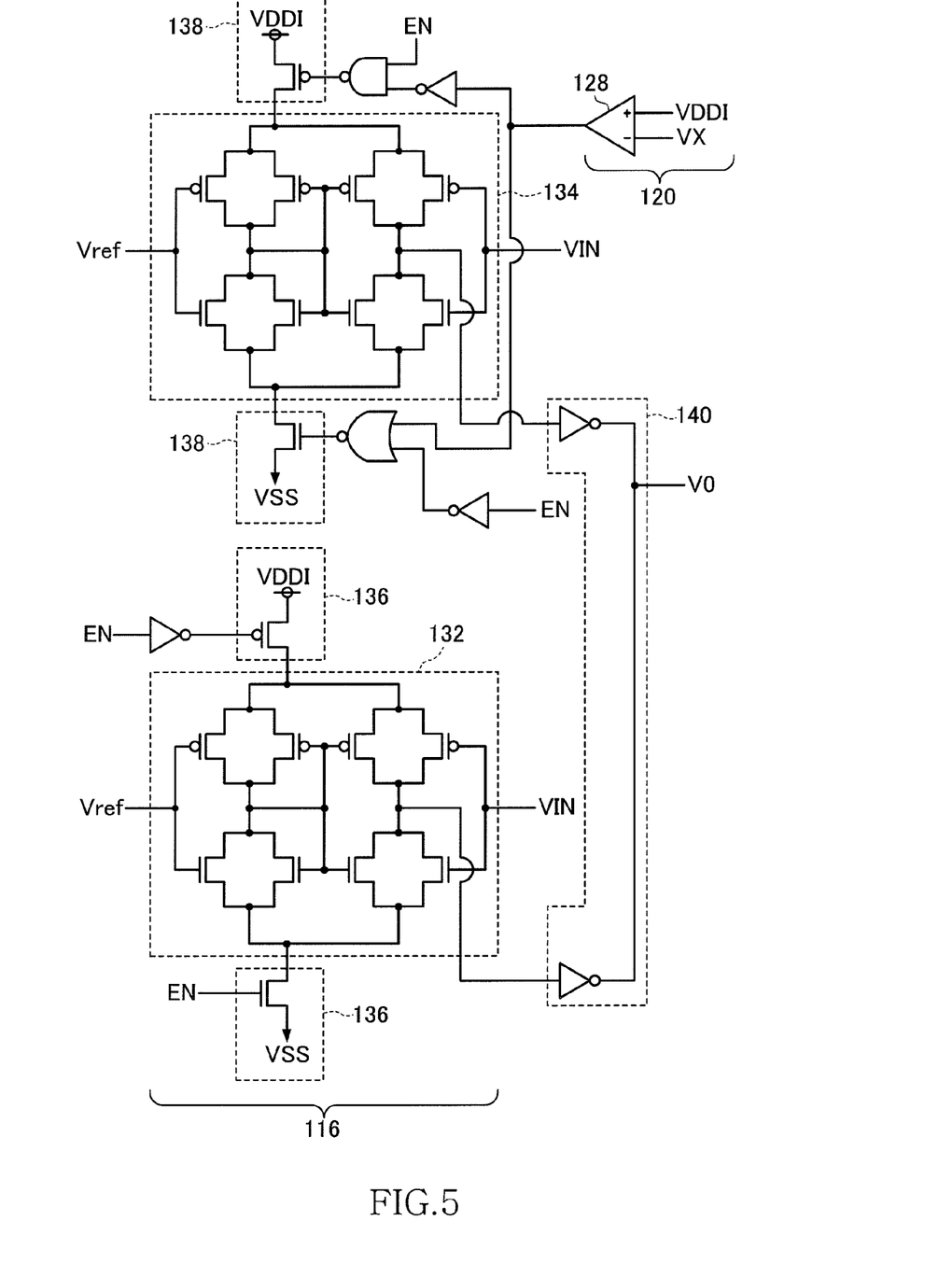
FIG. 5 is a modification of the circuit diagram of the input signal discrimination unit and the power supply sensor circuit.

FIG. 5 is a modification of the circuit diagram of the input signal discrimination unit 116 and the power supply sensor circuit 120. The input signal discrimination unit 116 according to the modification includes a first discrimination unit 132 and a second discrimination unit 134. The first discrimination unit 132 is a main operation circuit which is activated in normal operation. The second discrimination unit 134 is an assisting circuit which is activated when the power supply potential VDDI drops. When the enable signal EN becomes high level, a first current source 136 is activated so that an operating current is supplied from the first current source 136 to the first discrimination unit 132. In the meantime, the second determination unit 134 makes no operation because a second current source 138 is not activated. If the enable signal EN is at a high level and VDDI<VX, the second current source 138 is activated so that an operating current is supplied from the second current source 138 to the second discrimination unit 134. Since the first current source 136 and the second current source 138 are simultaneously activated, the first discrimination unit 132 and the second discrimination unit 134 both make an operation. Even in such a modification, when VDDI drops, it is possible to compensate a decrease in the operating current by the activation of the second discrimination unit 134. The outputs of the first discrimination unit 132 and the second discrimination unit 134 are synthesized into a signal V0 by a synthesis circuit unit 140. The two inverters in the synthesis circuit unit 140 which receive the output of the first discrimination unit 132 and the output of the second discrimination unit 134, respectively, are configured to provide a high impedance with respect to the node of the signal V0 when the respective corresponding first and second discrimination units 132 and 134 are not in operation. The high impedance control is performed in synchronization with the control of the first current source 136 and the second current source 138, for example.

Figure 6:
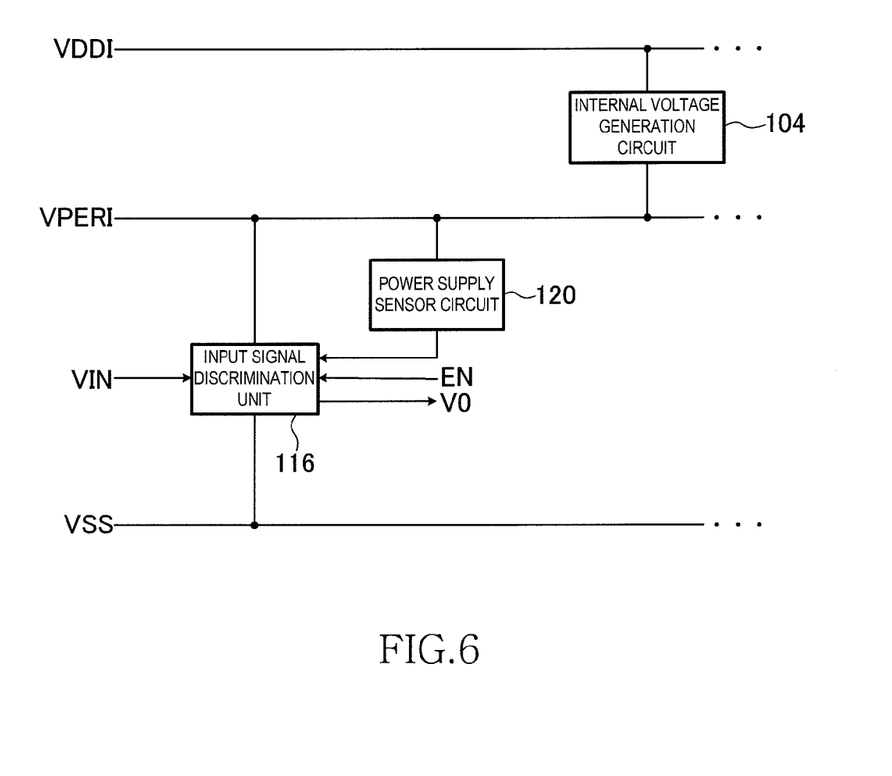
FIG. 6 is a modification of the functional block diagram of the input signal discrimination unit.

FIG. 6 is a modification of the functional block diagram of the input signal discrimination unit 116 and its vicinity. Unlike FIG. 2, the input signal discrimination unit 116 in FIG. 6 is driven in the range of VSS to VPERI. The input signal discrimination unit 116 is connected to the second power supply line (VPERI) and the third power supply line (VSS). More specifically, the PMOS transistors P1 and P2 are connected to the second power supply line (VPERI). The power supply sensor circuit 120 is connected to the second power supply line, and detects a drop in the potential VPERI instead of the potential VDDI. The reference potential VX input to the power supply sensor circuit 120 is set to 1.0 (V) which is the same as the voltage VPERI at normal time. Such a circuit that makes a determination on the input signal in the range of VSS to VPERI can also compensate a decrease of the operating current due to a drop in the potential VPERI.

The technical concept of the present invention is applicable, for example, to an external signal input circuit or the like that converts various types of control signals, address signals, data signals, etc. supplied from outside into internal signals. The circuit forms of the input signal discrimination unit 116, the power supply sensor circuit 120, the first control elements 122, the second control elements 124, the discrimination unit 126, and the like, and circuits for generating other control signals are not limited to the circuit forms disclosed in the present embodiment.

The technical concept of the input signal discrimination circuit 116 of the present invention may be applied to various semiconductor devices. For example, the present invention may be applied to semiconductor products in general, including CPUs (Central Processing Units), MCUs (Micro Control Units), DSPs (Digital Signal Processors), ASICs (Application Specific Integrated Circuits), ASSPs (Application Specific Standard Circuits), and Memories. Examples of the product types of the semiconductor devices to which the present invention is applicable include an SOC (System On Chip), MCP (Multi Chip Package), and POP (Package On Package). The present invention may be applied to semiconductor devices that have any of such product types and package types.

When the transistors are field effect transistors (FETs), various FETs are applicable, including MIS (Metal Insulator Semiconductor) and TFT (Thin Film Transistor) as well as MOS (Metal Oxide Semiconductor). A part of the device may even include bipolar transistors.

The PMOS transistors are a representative example of the transistor of first conductivity type. The N-channel transistors or NMOS transistors are a representative example of the transistor of second conductivity type.

It is apparent that the present invention is not limited to the above embodiments, but may be modified and changed without departing from the scope and spirit of the invention.

What is claimed is:

1. A semiconductor device comprising:
    an input signal discrimination unit that operates with a power supply potential supplied from a first power supply line; and
    a power supply sensor that compares the power supply potential with a predetermined potential, wherein
    the input signal discrimination unit includes:
    a discrimination unit that determines a logic level of an input signal; and
    a current source that is connected to the first power supply line and supplies an operating current having a first current value to the discrimination unit, wherein
    even when the power supply sensor detects a drop in the power supply potential from the predetermined potential, the current source supplies the operating current having the first current value to the discrimination unit by compensating a decrease of the operating current so as to prevent the first current value from decreasing.

2. The semiconductor device as claimed in claim 1, wherein
    the current source includes a first and second control elements that are connected in parallel between the first power supply line and the discrimination unit,
    the power supply sensor deactivates the second control element when the power supply potential of the first power supply line is higher than or equal to the predetermined potential, and
    the power supply sensor activates the second control element when the power supply potential of the first power supply line is lower than the predetermined potential.

3. The semiconductor device as claimed in claim 2, wherein the first control element is activated or deactivated based on an enable signal.

4. The semiconductor device according as claimed in 1, wherein
    the input signal discrimination unit includes:
    a first and second discrimination units that included the discrimination unit and each of which discriminates the logic level of the input signal;
    a first and second current sources that included the current source and connected to the first power supply line, each of the first and second current sources supplying an operating current to the first and second discrimination units, respectively; and
    a synthesis circuit unit that synthesizes output signals of the first and second discrimination units, and wherein
    the power supply sensor deactivates the second current source when the power supply potential of the first power supply line is higher than or equal to the predetermined potential, and
    the power supply sensor activates the second current source when the power supply potential of the first power supply line is lower than the predetermined potential.

5. The semiconductor device as claimed in claim 4, wherein the first and second current sources are activated or deactivated based on an enable signal.

6. The semiconductor device as claimed in claim 1, wherein
    the power supply sensor includes a differential circuit that operates with the power supply potential supplied from the first power supply line, and
    the power supply potential supplied from the first power supply line is supplied to one input node of the differential circuit, and the predetermined potential is supplied to another input node of the differential circuit.

7. The semiconductor device as claimed in claim 1, wherein the power supply potential of the first power supply line is substantially equal with an external potential supplied from outside of the semiconductor device.

8. The semiconductor device as claimed in claim 7, further comprising:
    a second power supply line;
    an internal power supply generation circuit that steps down the external potential supplied from outside of the semiconductor device to supply an internal power supply potential lower than the external potential to the second power supply line; and
    an internal circuit to which an output signal of the input signal discrimination unit is supplied,
    wherein the internal circuit operates with the internal power supply potential supplied from the second power supply line.

9. The semiconductor device as claimed in claim 1, further comprising an internal power supply generation circuit that steps down an external potential supplied from outside of the semiconductor device to supply the power supply potential lower than the external potential to the first power supply line.

10. The semiconductor device as claimed in claim 1, wherein the input signal is supplied from outside of the semiconductor device.

11. The semiconductor device as claimed in claim 2, wherein the power supply potential of the first power supply line is substantially equal with an external potential supplied from outside of the semiconductor device.

12. The semiconductor device as claimed in claim 4, wherein the power supply potential of the first power supply line is substantially equal with an external potential supplied from outside of the semiconductor device.

13. The semiconductor device as claimed in claim 11, further comprising:
    a second power supply line;
    an internal power supply generation circuit that steps down the external potential supplied from outside of the semiconductor device to supply an internal power supply potential lower than the external potential to the second power supply line; and
    an internal circuit to which an output signal of the input signal discrimination unit is supplied,
    wherein the internal circuit operates with the internal power supply potential supplied from the second power supply line.

14. The semiconductor device as claimed in claim 12, further comprising:
    a second power supply line;
        an internal power supply generation circuit that steps down the external potential supplied from outside of the semiconductor device to supply an internal power supply potential lower than the external potential to the second power supply line; and
        an internal circuit to which an output signal of the input signal discrimination unit is supplied,
        wherein the internal circuit operates with the internal power supply potential supplied from the second power supply line.

15. The semiconductor device as claimed in claim 2, further comprising an internal power supply generation circuit that steps down an external potential supplied from outside of the semiconductor device to supply the power supply potential lower than the external potential to the first power supply line.

16. The semiconductor device as claimed in claim 4, further comprising an internal power supply generation circuit that steps down an external potential supplied from outside of the semiconductor device to supply the power supply potential lower than the external potential to the first power supply line.

17. The semiconductor device as claimed in claim 1, further comprising:
   a second power supply line;
   an internal power supply generation circuit that steps down the external potential supplied from outside of the semiconductor device to supply an internal power supply potential lower than the external potential to the second power supply line;
   a signal output unit is supplied an output signal of the discrimination unit; and
   an internal circuit to which an output signal of the signal output unit is supplied,
   wherein both of the internal circuit and the signal output unit operates with the internal power supply potential supplied from the second power supply line.

18. The semiconductor device as claimed in claim 8, further comprising a signal output unit is supplied an output signal of the discrimination unit, and outputs an output signal as the output signal of the input signal discrimination unit, wherein
   the signal output unit operates with the internal power supply potential supplied from the second power supply line.

19. The semiconductor device as claimed in claim 13, further comprising a signal output unit is supplied an output signal of the discrimination unit, and outputs an output signal as the output signal of the input signal discrimination unit, wherein
   the signal output unit operates with the internal power supply potential supplied from the second power supply line.

20. The semiconductor device as claimed in claim 14, further comprising a signal output unit is supplied an output signal of the discrimination unit, and outputs an output signal as the output signal of the input signal discrimination unit, wherein
   the signal output unit operates with the internal power supply potential supplied from the second power supply line.

* * * * *